(12) United States Patent
    Tokumitsu

(10) Patent No.: US 8,106,989 B2
(45) Date of Patent: Jan. 31, 2012

(54) SOLID-STATE IMAGE CAPTURING APPARATUS, DRIVING METHOD OF THE SOLID-STATE IMAGE CAPTURING APPARATUS, AND ELECTRONIC INFORMATION DEVICE

(75) Inventor: Chie Tokumitsu, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 736 days.

(21) Appl. No.: 12/289,610

(22) Filed: Oct. 30, 2008

(65) Prior Publication Data

US 2009/0128674 A1    May 21, 2009

(30) Foreign Application Priority Data

Oct. 30, 2007   (JP) ................... 2007-282488

(51) Int. Cl.
    *H04N 3/14*  (2006.01)
(52) U.S. Cl. ................. 348/315; 348/311; 348/294
(58) Field of Classification Search .......... 348/311–316, 348/241–251, 294; 257/290–295
    See application file for complete search history.

(56) References Cited

U.S. PATENT DOCUMENTS

2009/0002534 A1 *  1/2009  Baba ........................... 348/302
2009/0219422 A1 *  9/2009  Takeuchi et al. ............. 348/300

FOREIGN PATENT DOCUMENTS

JP         11-008801         1/1999

* cited by examiner

*Primary Examiner* — Mohammed Hasan
(74) *Attorney, Agent, or Firm* — Edwards Wildman Palmer LLP; David G. Conlin; George N. Chaclas

(57) ABSTRACT

A solid-state image capturing apparatus includes a plurality of pixel sections, a vertical transfer section, and a horizontal transfer section, wherein the horizontal transfer section includes a plurality of transfer gates consecutively arranged in a horizontal direction and a signal wiring for supplying a driving signal to the transfer gates, and wherein a layout pattern of at least one layer of constituent members which constitute the horizontal transfer section is a pattern in which the transfer gates and the signal wiring are connected so that electric charge transfer directions become opposite from each other on both sides of a branching position in the horizontal transfer section.

23 Claims, 9 Drawing Sheets

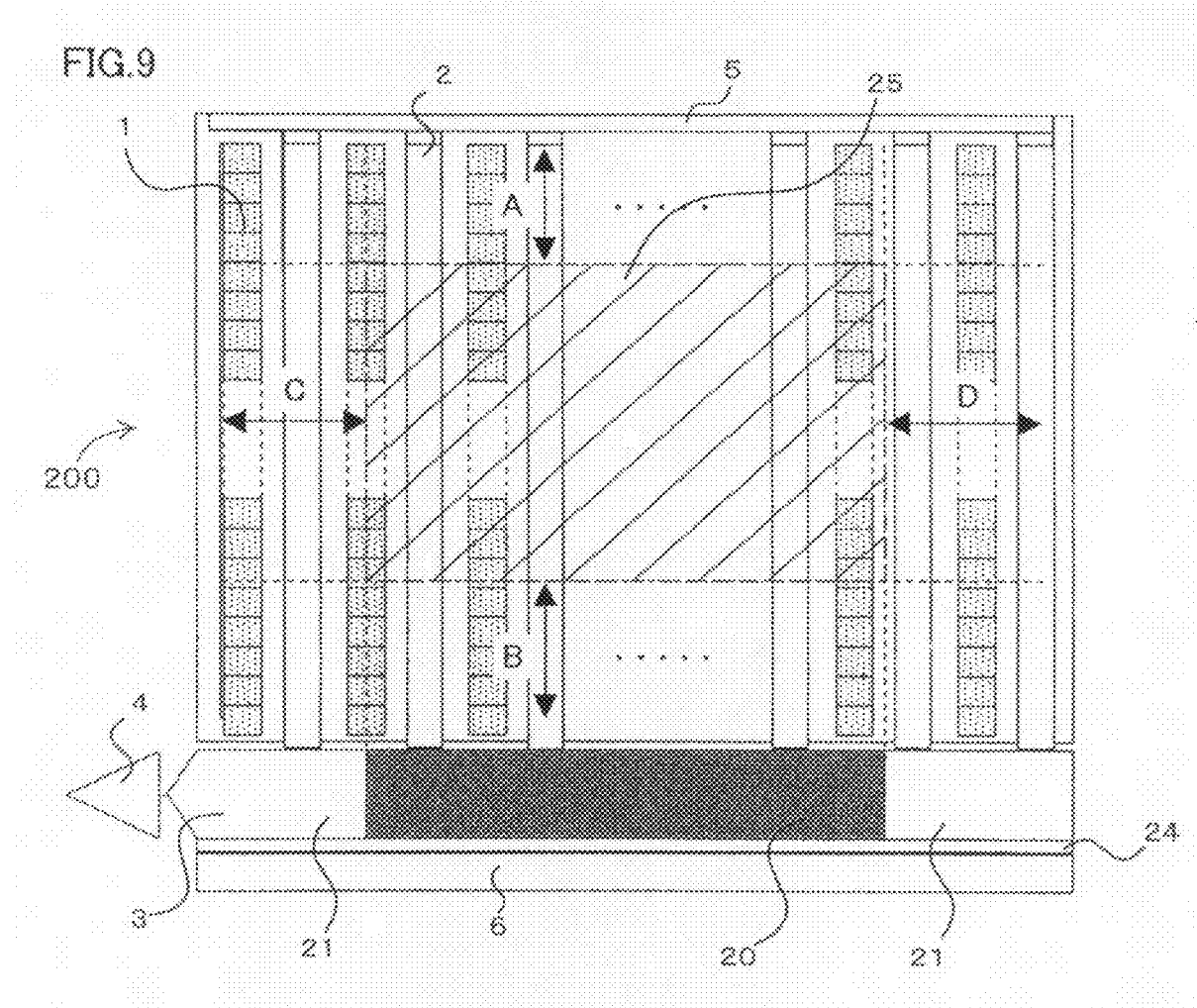

SOLID-STATE IMAGE CAPTURING APPARATUS, DRIVING METHOD OF THE SOLID-STATE IMAGE CAPTURING APPARATUS, AND ELECTRONIC INFORMATION DEVICE

This nonprovisional application claims priority under 35 U.S.C. §119(a) to Patent Application No. 2007-282488 filed in Japan on Oct. 30, 2007, the entire contents of which are hereby incorporated by reference.

BACKGROUND OF THE INVENTION

1. Field of the Invention

The present invention relates to a solid-state image capturing apparatus, a driving method of the solid-state image capturing apparatus, and an electronic information device. In particular, the present invention relates to a solid-state image capturing apparatus, in which a charge transferring direction of a horizontal transfer section is configured to be reversed on both sides of a predetermined position; a driving method of the solid-state image capturing apparatus; and an electronic information device.

2. Description of the Related Art

In general, a solid-state image capturing apparatus transfers electric charges generated by photoelectric conversions in a plurality of pixel sections (also simply referred to as a pixel, hereinafter) arranged in a two dimensional array by a vertical transfer section corresponding to each pixel section column in the vertical direction for each individual pixel section. The solid-state image capturing apparatus subsequently transfers the electric charges from the vertical transfer section by a horizontal transfer section, which is positioned at one end side of the vertical transfer section, to the horizontal direction for each line to be sent to an output section, and the solid-state image capturing apparatus outputs the electric charges as image capturing signals from the output section.

When capturing a video, the transferring of an electric charge from a light receiving section (pixel section) to an output section needs to be completed within a certain period of time in accordance with a frame rate, and the transferring of an electric charge requires a sufficient period of time so as not to cause deterioration due to the transferring. Therefore, it is required for a period of time for both the vertical transfer and the horizontal transfer to be set in view of the efficiency of the transfer.

In addition, a common solid-state image capturing apparatus has a configuration in which electric charges of all the effective pixels are transferred in the vertical direction, and subsequently, the electric charges are transferred in the horizontal direction to be sent to an output section. Therefore, such a solid-state image capturing apparatus is required for transferring electric charges with the same amount of time for all the effective pixels or for electric charges of a pixel of one frame even when the number of pixels required for capturing an image is smaller than the number of effective pixels.

For such a problem, Reference 1 discloses a method for, by providing a horizontal CCD drain gate between a horizontal CCD, which is a horizontal charge transfer section, and a horizontal CCD drain positioned near the horizontal CCD along the transfer direction, sweeping out unnecessary electric charges at once from the horizontal CCD to the horizontal CCD drain.

FIG. 9 is a diagram illustrating a method disclosed in Reference 1 described above, which illustrates a solid-state image capturing apparatus according to this method.

A solid-state image capturing apparatus 200 includes: a plurality of pixel sections 1 positioned in a matrix for photoelectrically converting an incident light into a signal charge; a vertical transfer section 2 for reading out the signal charge stored in each of the pixel sections 1 to transfer it in a column direction (vertical direction); a horizontal transfer section 3 for transferring the signal charge from the vertical transfer section 2 in a row direction (horizontal direction); and an output section 4 for amplifying the transferred signal charge and outputting it as an image capturing signal. Herein, the vertical transfer section 2 described above is positioned for each column of pixel sections and along each column of pixel sections, and the horizontal transfer section 3 described above is positioned at one end side of the vertical transfer section 2. In addition, a horizontal sweeping drain 6 is positioned on the opposite side of the horizontal transfer section 3 from a positional area of the pixel section described above, and a horizontal CCD drain gate 24 is positioned between the horizontal sweeping drain 6 and the horizontal transfer section 3. In addition, a vertical sweeping drain 5 is positioned on the opposite end of the vertical transfer section 2 described above.

Next, an operation will be described.

Herein, the center portion of the effective pixel area (i.e., area having pixel sections arranged in a matrix therein) in the solid-state image capturing apparatus is defined as a desirable image cutting out area 25. Therefore, electric charges generated in areas A and B are unnecessary electric charges, the area A being positioned above the upper end position of the pixel cutting out area 25 and the area B being positioned below the lower end position of the pixel cutting out area 25. Similarly, electric charges generated in areas C and D are unnecessary electric charges, the areas C and D being positioned on the left and right sides of the pixel cutting out area 25.

According to the conventional technique, when the unnecessary electric charges generated in the areas A and B are vertically transferred, the horizontal CCD drain gate 24 is turned on, and the unnecessary electric charges transferred to the horizontal transfer section 3 is drained to the horizontal sweeping drain 6 without being transferred in the horizontal direction. Further, unnecessary electric charges generated in the areas C and D and electric charges for one line including necessary electric charges generated in the desired pixel cutting out area 25, are vertically transferred to the horizontal transfer section. Subsequently, when the electric charges transferred in the horizontal transfer section is horizontally transferred, necessary electric charges 20 generated in the desirable pixel cutting out area 25 are transferred to the output section 4 subsequent to unnecessary electric charges 21 generated in the area C, and the horizontal CCD drain gate 24 is turned on to drain the unnecessary electric charges to the horizontal sweeping drain 6. As a result, among all the electric charges generated in the entire effective pixels of an image capturing element, unnecessary electric charges are thrown away, making it possible to reduce a driving frequency of a horizontal CCD functioning as a horizontal transfer section.
Reference 1: Japanese Laid-Open Publication No. 11-8801

SUMMARY OF THE INVENTION

According to the conventional technique described above, however, it is required to drive the horizontal CCD drain gate 24 at a predetermined timing so as to effectively transfer electric charges generated in the desirable area (pixel cutting out area) of the effective pixel area. Therefore, a signal terminal is required for applying such a driving signal to the horizontal CCD drain gate 24. Further, a driving circuit is also required for generating a driving timing pattern of the gate, namely a driving signal. As a result, the number of the terminals will increase and another circuit will be added for creating the driving timing pattern, resulting in the expansion of the circuit configuration.

The present invention is intended to solve the conventional problems described above. The objective of the present invention is to provide a solid-state image capturing apparatus, a driving method of the solid-state image capturing apparatus, and an electronic information device using the solid-state image capturing apparatus, where the solid-state image capturing apparatus includes a transfer branching position of an area for transferring electric charges as necessary electric charges in a predetermined direction and an area for transferring electric charges in a reverse direction, the transfer branching position being able to be arbitrarily set by a layout pattern for members to constitute the horizontal transfer section, so that necessary electric charges can be effectively transferred by the driving of the horizontal transfer section, and further, the driving frequency of the horizontal CCD can be reduced at the time of reading out the necessary electric charges from a partial area of the effective pixel area without adding another circuit configuration for sweeping out unnecessary electric charges.

A solid-state image capturing apparatus according to the present invention includes: a plurality of pixel sections positioned in an array for photoelectrically converting an incident light into a signal charge; a vertical transfer section for transferring the signal charge read out from each of the pixel sections in a vertical direction; and a horizontal transfer section for transferring the signal charge transferred from the vertical transfer section in a horizontal direction, wherein the horizontal transfer section includes a plurality of transfer gates consecutively arranged in a horizontal direction, and a signal wiring for supplying a driving signal to the transfer gates, wherein a layout pattern of at least one layer of constituent members constituting the horizontal transfer section is a pattern in which the transfer gates and the signal wiring are connected so that electric charge transfer directions become opposite from each other on both sides of a branching position in the horizontal transfer section, thereby achieving the objective described above.

Preferably, in a solid-state image capturing apparatus according to the present invention, the horizontal transfer section includes: a first transfer electrode configured of two adjacent transfer gates and driven by a first driving signal; a second transfer electrode formed of two adjacent transfer gates and driven by a second driving signal, which has a reversed phase from the first driving signal; a first signal wiring for supplying the first driving signal to the transfer gates that configure the first transfer electrode; and a second signal wiring for supplying the second driving signal to the transfer gates that configure the first transfer electrode.

Still preferably, in a solid-state image capturing apparatus according to the present invention, the first signal wiring and the second signal wiring are formed by patterning a same metal layer.

Still preferably, in a solid-state image capturing apparatus according to the present invention, the first signal wiring is formed by patterning a first metal layer, and the second signal wiring is formed by patterning a second metal layer, which is different from the first metal layer.

Still preferably, in a solid-state image capturing apparatus according to the present invention, a layout pattern of the first and second signal wirings is a pattern in which the transfer gates and the signal wiring are connected so that electric charge transferring directions are opposite from each other on both sides of a predetermined position in the horizontal transfer section.

Still preferably, in a solid-state image capturing apparatus according to the present invention, one of the two adjacent transfer gates that configure the first transfer electrode is formed by patterning a first polysilicon layer, and the other of the two adjacent transfer gates is formed by patterning a second polysilicon layer different from the first polysilicon layer, one of the two adjacent transfer gates that configure the second transfer electrode is formed by patterning the first polysilicon layer, and the other of the two adjacent transfer gates is formed by patterning the second polysilicon layer.

Still preferably, in a solid-state image capturing apparatus according to the present invention, the four transfer gates that configure the adjacent first and second transfer electrodes are first to fourth transfer gates consecutively arranged in a horizontal direction, and the first to fourth transfer gates have different plan view forms.

Still preferably, in a solid-state image capturing apparatus according to the present invention, on one side of a predetermined position in the horizontal transfer section, the first transfer electrode is configured of the first and second transfer gates and the second transfer electrode is configured of the third and fourth transfer gates; and on the other side of a predetermined position in the horizontal transfer section, the first transfer electrode is configured of the second and third transfer gates and the second transfer electrode is configured of the fourth and first transfer gates.

Still preferably, in a solid-state image capturing apparatus according to the present invention, a layout pattern of a plurality of transfer gates that configure the first and second transfer electrodes is a pattern in which the transfer gates and the signal wiring are connected so that electric charge transferring directions become opposite from each other on both sides of a predetermined position in the horizontal transfer section.

Still preferably, in a solid-state image capturing apparatus according to the present invention, one of the two adjacent transfer gates that configure the first transfer electrode is formed by patterning a first polysilicon layer, and the other of the two adjacent transfer gates is formed by patterning a second polysilicon layer different from the first polysilicon layer, and wherein one of the two adjacent transfer gates that configure the second transfer electrode is formed by patterning the first polysilicon layer, and the other of the two adjacent transfer gates is formed by patterning the second polysilicon layer.

Still preferably, in a solid-state image capturing apparatus according to the present invention, the four transfer gates that configure the adjacent first and second transfer electrodes are first to fourth transfer gates consecutively arranged in a horizontal direction, the first transfer gate and the third transfer gate having the same plan view form, and the second transfer gate and the fourth transfer gate having the same plan view form.

Still preferably, in a solid-state image capturing apparatus according to the present invention, on one side of a predetermined position in the horizontal transfer section, the first transfer electrode is configured of the first and second transfer gates and the second transfer electrode is configured of the third and fourth transfer gates; and on the other side of a predetermined position in the horizontal transfer section, the first transfer electrode is configured of the second and third transfer gates and the second transfer electrode is configured of the fourth and first transfer gates.

Still preferably, a solid-state image capturing apparatus according to the present invention further includes an output section positioned on either of one end side or the other end side of the horizontal transfer section, for outputting a signal charge from the horizontal transfer section as an image capturing signal, wherein the horizontal transfer section transfers unnecessary electric charges from the vertical transfer section in an opposite direction of the output section from the branching position.

Still preferably, a solid-state image capturing apparatus according to the present invention further includes a first output section positioned on one end side of the horizontal transfer section for outputting a signal charge from the horizontal transfer section as an image capturing signal; and a second output section positioned on the other end side of the horizontal transfer section for outputting a signal charge from the horizontal transfer section as an image capturing signal.

Still preferably, in a solid-state image capturing apparatus according to the present invention, the branching position is set at an arbitrary position in the horizontal transfer section by changing one or more layers of a layout pattern of constituent members that constitute the horizontal transfer section.

Still preferably, in a solid-state image capturing apparatus according to the present invention, mask patterns other than mask patterns corresponding to the changed layout pattern are shared among solid-state image capturing apparatuses having the different branching positions.

Still preferably, a solid-state image capturing apparatus according to the present invention further includes a horizontal drain positioned on the opposite side of the output section of the horizontal transfer section, for sweeping out the unnecessary electric charges.

Still preferably, in a solid-state image capturing apparatus according to the present invention, the horizontal transfer section is configured to set the predetermined position by the layout pattern for the constituent members which constitute the horizontal transfer section, so that pixel sections with fewer than the number of the effective pixels, which is the number of the plurality of pixel sections positioned in an array, is used as pixel sections that constitute an image capturing area.

Still preferably, in a solid-state image capturing apparatus according to the present invention, a layout pattern of the constituent members which constitute the horizontal transfer section is any of a layout pattern of the transfer gates, a layout pattern of the signal wiring, and a layout pattern of a contact layer connecting the transfer gates and the signal wiring.

Still preferably, in a solid-state image capturing apparatus according to the present invention, the horizontal transfer section drives the transfer gates by a driving signal of three phases or more.

A driving method according to the present invention drives the solid-state image capturing apparatus described above, in which a driving signal is supplied to a plurality of transfer gates in a horizontal transfer section in the solid-state image capturing apparatus, so that, on one side of a branching position of the horizontal transfer section, electric charges from the vertical transfer section are transferred as necessary electric charges to a signal processing section positioned on one end side of the horizontal transfer section, and on the other side of the branching position of the horizontal transfer section, electric charges from the vertical transfer section are transferred as unnecessary electric charges to an electric charge sweeping section positioned on the other end side, thereby achieving the objective described above.

A driving method according to the present invention drives the solid-state image capturing apparatus described above, in which a driving signal is supplied to a plurality of transfer gates in a horizontal transfer section in the solid-state image capturing apparatus, so that, on one side of a branching position of the horizontal transfer section, electric charges from the vertical transfer section are transferred as necessary electric charges to a first signal processing section positioned on one end side of the horizontal transfer section, and on the other side of the branching position of the horizontal transfer section, electric charges from the vertical transfer section are transferred as necessary electric charges to a second signal processing section positioned on the other end side, thereby achieving the objective described above.

An electronic information device according to the present invention includes an image capturing section, wherein the image capturing section includes the solid-state image capturing apparatus according to the present invention, thereby achieving the objective described above.

Hereinafter, the function of the present invention will be described.

According to the present invention, in a horizontal transfer section including a plurality of transfer gates consecutively arranged in the horizontal direction and a signal wiring for providing a driving signal for the transfer gates, a layout pattern of at least one layer of the members that constitute the horizontal transfer section is defined to be a pattern to connect the transfer gates and the signal wiring so that the electric charge transferring directions will be opposite from each other on both sides of the branching position in the horizontal transfer section. Therefore, the position for transferring electric charges for horizontal transferring to the left and right directions can be arbitrarily set by a change of one or more layers of the layout pattern. In addition, an output section is positioned on one terminal side of the horizontal transfer section and a sweeping drain is positioned on the other terminal side, and electric charges are transferred to either the output section or the sweeping drain, in such a manner, for example, that necessary electric charges are transferred to the output section and unnecessary electric charges are transferred to the sweeping drain, so that a horizontal transfer period can be conserved and a horizontal driving frequency can be reduced without dropping the frame rate.

As a result, the driving frequency of the horizontal CCD can be reduced at the time of reading out necessary electric charges from a partial area in the effective pixel area, without additionally adding a circuit configuration for sweeping out unnecessary electric charges, namely a terminal for applying a driving signal to an electric charge sweeping drain gate and a circuit for creating the driving signal.

In the solid-state image capturing apparatus described above according to the present invention, the horizontal transfer section is configured to set the predetermined position by the layout pattern for the members to constitute the horizontal transfer section, so that pixel sections with fewer than the number of the effective pixels, which is the number of the plurality of pixel sections positioned in an array, will be used as pixels that constitute the image capturing area. As a result, the switching to a solid-state image capturing apparatus which uses pixels fewer than the number of effective pixels for capturing an image can be achieved by the change of one or more layers of the layout pattern.

In the solid-state image capturing apparatus described above according to the present invention, the layout pattern for the members to constitute the horizontal transfer section is any of the layout pattern for the transfer gate, the layout pattern for the signal wiring and the layout pattern for a contact layer that connects the transfer gate and the signal wiring. Therefore, the position for transferring electric charges to the left and right can be arbitrarily set by the change of a metal wiring layer as the signal wiring, a contact layer, or a polysilicon layer that constitute the transfer gate.

According to the present invention with the configuration described above, a transfer branching position of an area for transferring electric charges as necessary electric charges in a predetermined direction and an area for transferring electric charges as unnecessary electric charges in a reverse direction, can be arbitrarily set inside the horizontal transfer section in the solid-state image capturing apparatus by the layout pattern for the members to constitute the horizontal transfer section. As a result, necessary electric charges can be effectively transferred by the driving of the horizontal transfer section, and further, the driving frequency of the horizontal CCD can be reduced at the time of reading out the necessary electric charges from a partial area of the effective pixel area without adding another circuit configuration for sweeping out unnecessary electric charges.

These and other advantages of the present invention will become apparent to those skilled in the art upon reading and understanding the following detailed description with reference to the accompanying figures.

BRIEF DESCRIPTION OF THE DRAWINGS

FIG. 2(a) illustrates a layout of a transfer gate and a wiring in the horizontal transfer section. FIGS. 2(b) and 2(c) illustrate a plan view form of a transfer gate in a first layer.

FIG. 5(a) illustrates a layout of a transfer gate and a wiring in a horizontal transfer section. FIGS. 5(b) and 5(c) illustrate a plan view form of a transfer gate in a first layer.

FIGS. 7(a) and 7(b) illustrate a plan view form of a transfer gate in a first layer in a horizontal transfer section. FIG. 7(c) illustrates a plan view form of a transfer gate in a second layer.

FIG. 9 is a diagram explaining a method disclosed in Reference 1, illustrating a solid-state image capturing apparatus adopting this method.

Figure 1:
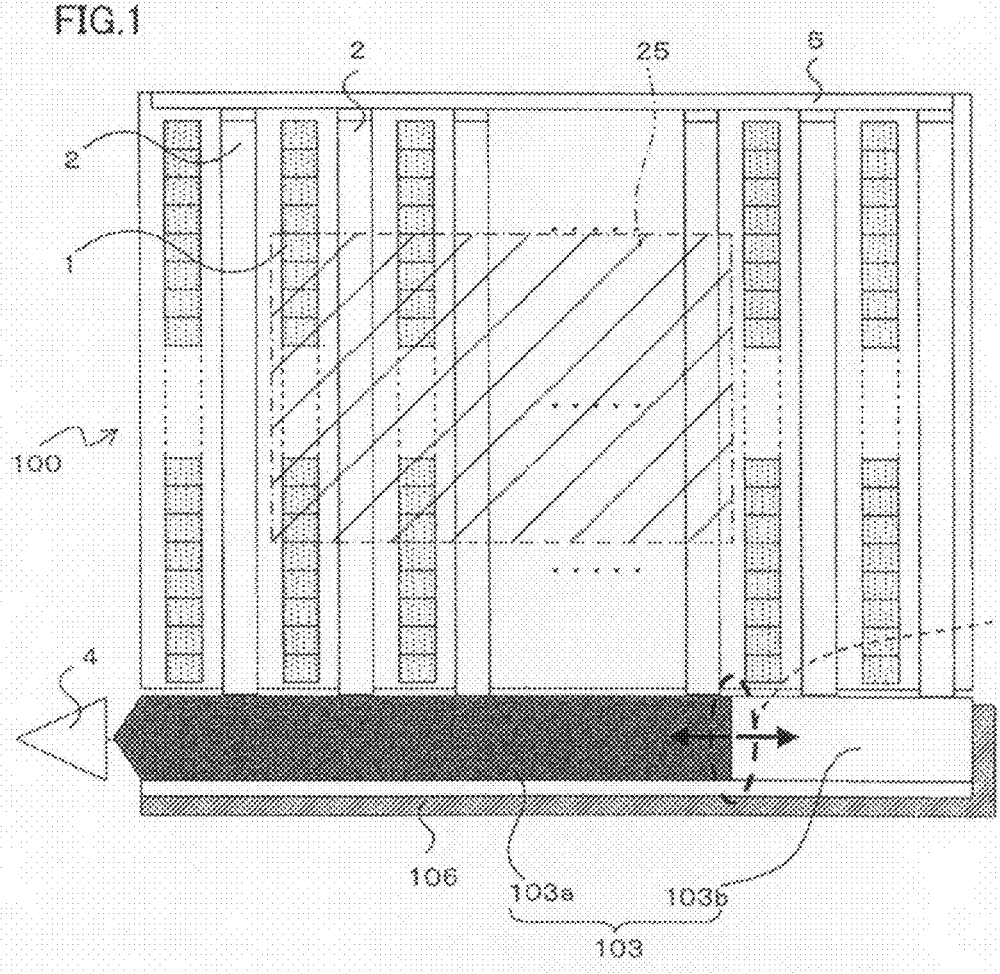
FIG. 1 is a schematic view illustrating a solid-state image capturing apparatus according to Embodiment 1 of the present invention.

1 pixel section
2 vertical transfer section
3 horizontal transfer section
4 output section
5 vertical sweeping drain
25 pixel cutting out area
100 solid-state image capturing apparatus
103, 203, 303 horizontal transfer section
106 horizontal sweeping drain
X transfer branching boundary (transfer branching position)

DESCRIPTION OF THE PREFERRED EMBODIMENTS

Hereinafter, embodiments of the present invention will be described with reference to the accompanying figures.

Embodiment 1

FIG. 1 is a schematic view illustrating a solid-state image capturing apparatus according to Embodiment 1 of the present invention.

A solid-state image capturing apparatus 100 according to Embodiment 1 includes: a plurality of pixel sections 1 positioned in a matrix for photoelectrically converting an incident light into a signal charge; a vertical transfer section 2 for reading out the signal charge stored in each of the pixel sections 1 to transfer it in a column direction (vertical direction); a horizontal transfer section 103 for transferring the signal charge from the vertical transfer section 2 to a row direction (horizontal direction); and an output section 4 for amplifying the transferred signal charge and outputting it as an image capturing signal. Herein, the vertical transfer section 2 described above is positioned for and along each column of pixel sections, and the horizontal transfer section 103 described above is positioned at one end side of the vertical transfer section 2. In addition, a vertical sweeping drain 5 is positioned on the opposite side of the vertical transfer section 2. Such a configuration is the same as the configuration of the conventional solid-state image capturing apparatus 200.

In addition, according to Embodiment 1, a horizontal sweeping drain 106 is positioned on the lower side of the horizontal transfer section 103 described above, namely on the opposite side of a positional area for the pixel sections 1 described above. The horizontal sweeping drain 106 has an L-letter shape in a plan view, being configured with a transverse portion along a lower edge of the horizontal transfer section 103 and a longitudinal portion along the right side edge of the horizontal transfer section 103 opposite from the output section 4.

In addition, the horizontal transfer section 103 described above is configured with a transfer branching boundary X (referred to as a transfer branching position, hereinafter) at a position corresponding to the right side in the figure of the pixel cutting out area 25 in the effective pixel area.

Specifically, the horizontal transfer section 103 includes a first transfer section 103a positioned on the output section 4 side (left side in the figure) of the transfer branching boundary X and a second transfer section 103b positioned on the opposite side (right side in the figure) from the output section 4 of the transfer branching boundary X. Herein, the first transfer section 103a described above is a CCD section for transferring electric charges transferred from the vertical transfer section 2 to the output section 4 side as necessary electric charges. The second transfer section 103b described above is a CCD section for transferring electric charges transferred from the vertical transfer section 2 to the longitudinal portion of the horizontal sweeping drain 106 described above as unnecessary electric charges.

Figure 2:
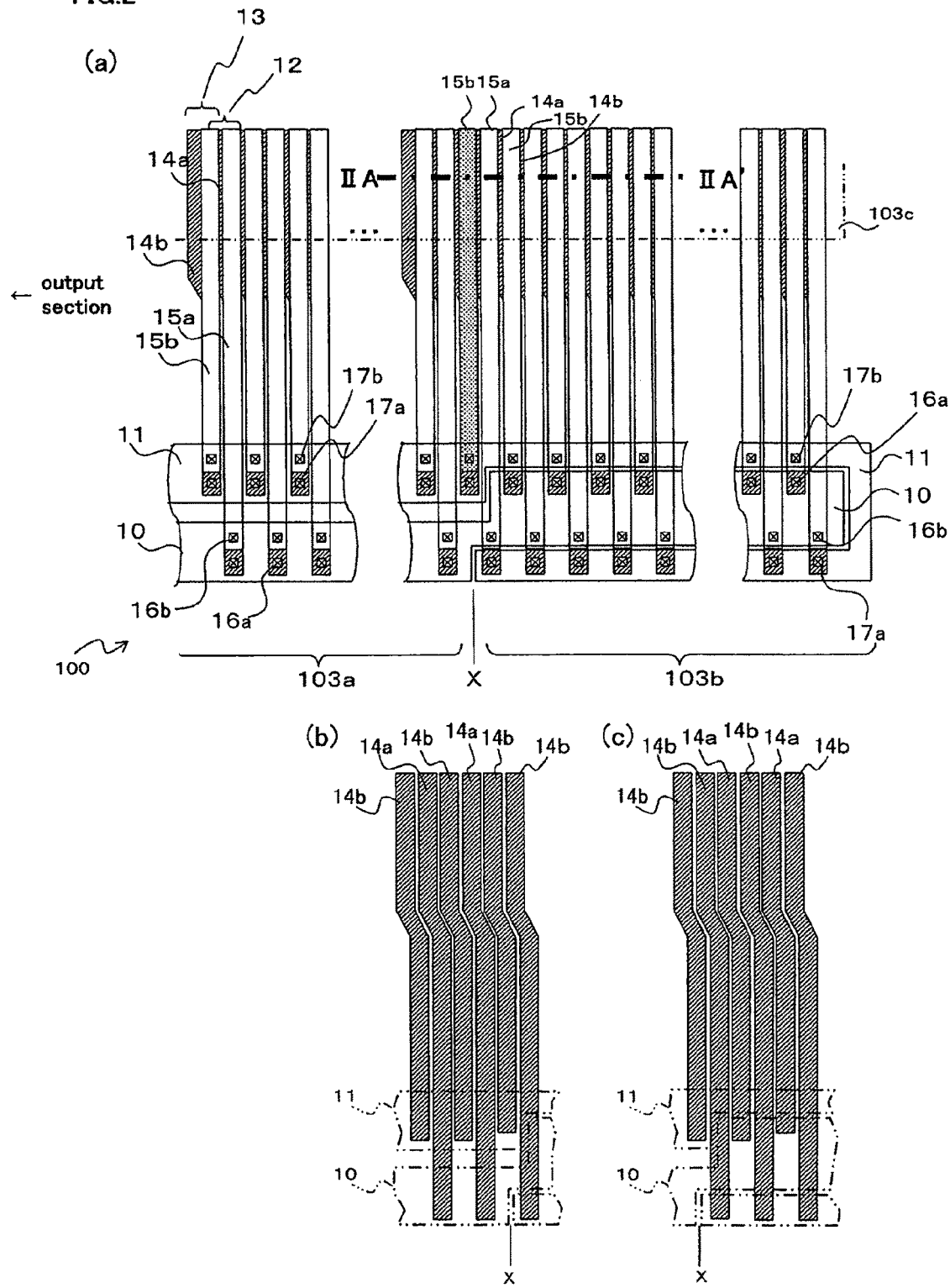
FIG. 2 is a diagram explaining a specific configuration of a horizontal transfer section in the solid-state image capturing apparatus according to Embodiment 1.
Figure 3:
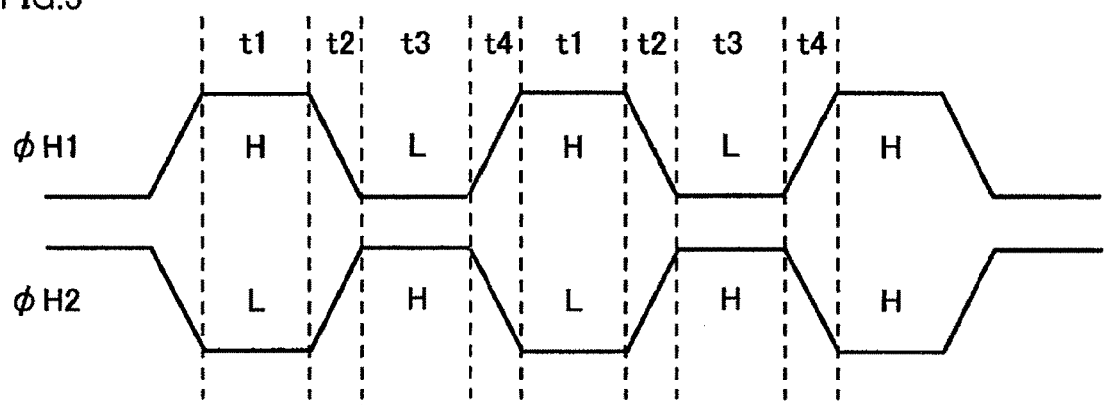
FIG. 3 is an illustrative diagram of the solid-state image capturing apparatus according to Embodiment 1, illustrating a timing chart of a driving pulse applied to the transfer gate in the horizontal transfer section of the solid-state image capturing apparatus.
Figure 4:
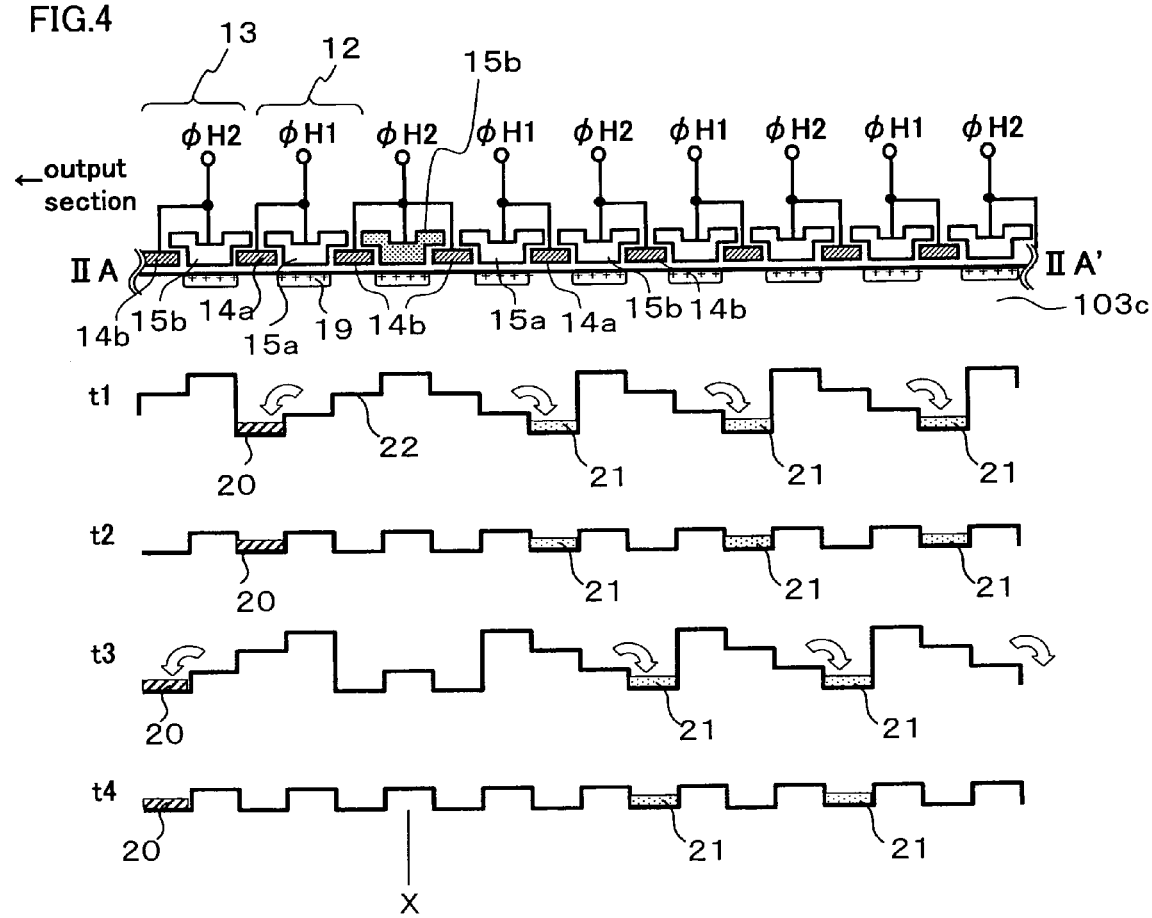
FIG. 4 is a diagram illustrating a cross sectional structure along the line IIA-IIA' in FIG. 4 and a potential distribution in the horizontal transfer section.

FIGS. 2 to 4 are diagrams illustrating specific configurations of the horizontal transfer section 103. FIG. 2 illustrates a layout of a transfer gate and a wiring of the horizontal transfer section 103. FIG. 3 illustrates a timing chart of driving pulses applied to the transfer gate. FIG. 4 illustrates a cross sectional structure along the line IIA-IIA' in FIG. 2 and a potential distribution in the horizontal transfer section 103.

As illustrated in FIG. 2(a), the horizontal transfer section 103 is arranged therein with a plurality of transfer gates 14a, 14b, 15a and 15b consecutively and repetitively in the horizontal transfer direction for transferring electric charges transferred from the vertical transfer section 2 in the horizontal direction.

Herein, the transfer gates 14a and 14b are transfer gates in the first layer, the transfer gates being formed by placing a first polysilicon film using a mask pattern. Further, the transfer gates 15a and 15b are transfer gates in the second layer, the transfer gates being formed by placing a second polysilicon film positioned above the first polysilicon film using a mask pattern.

In addition, a first driving pulse a φH1 is applied to the transfer gates 14a and 15a, and a second driving pulse φH2 is applied to the transfer gates 14b and 15b. That is, according to Embodiment 1 of the present invention, the horizontal transfer section 103 is configured to transfer signal charges of one packet by two-phase gates, to which the first and second driving pulses φH1 and φH2 are applied.

In detail, the transfer gate 15b in the second layer is positioned in a transfer branching position X of the horizontal transfer section 103. In addition, the transfer gate 15a in the second layer, the transfer gate 14a in the first layer, the transfer gate 15b in the second layer, and the transfer gate 14b in the first layer are repetitively arranged in the first horizontal CCD section 103a positioned on one side of the transfer branching position X, for transferring electric charges to the output section 4, in this order towards the direction to which electric charges are transferred (left direction in the figure). Further, the transfer gate 15a in the second layer, the transfer gate 14a in the first layer, the transfer gate 15b in the second layer, and the transfer gate 14b in the first layer are repetitively arranged in the second horizontal CCD section 103b positioned on the other side of the transfer branching position X for transferring electric charges towards the sweeping drain 106, in this order towards the direction to which electric charges are transferred (right direction in the figure).

Further, in an electric charge transfer area 103c for transferring electric charges below the transfer gates 15a and 15b in the second layer, a diffusion area 19 is formed for orienting an electric field so that a transferring direction is determined for transferring electric charges when the driving pulse described above is applied.

On the side of one end of the transfer gates, wirings 10 and 11 are positioned for supplying a two-phase driving pulse of each of the transfer gates described above. The wirings are formed by placing metal films formed in a pattern with an insulation film interposed above a polysilicon film forming the transfer gates described above. The wirings are connected to each of the transfer gates through a contact hole that penetrates the insulation film.

That is, in the first horizontal CCD section 103a on the one side (left side in the figure) of the transfer branching position X, the transfer gate 15a in the second layer and the transfer gate 14a in the first layer positioned on the left side and adjacent to the transfer gate 15a are connected respectively via contacts 16a and 16b to the metal wiring 10 that supplies the first driving pulse φH1, and the transfer gate 15b in the second layer and the transfer gate 14b positioned on the left side and adjacent to the transfer gate 15b are connected respectively via contacts 17a and 17b to the metal wiring 11 that supplies the second driving pulse φH2. As a result, in the first horizontal CCD 103a, the transfer gate 15a in the second layer and the transfer gate 14a in the first layer positioned on the left side form a φH1 transferring electrode 12, and the transfer gate 15b in the second layer and the transfer gate 14b positioned on the left side form a φH2 transferring electrode 13.

On the other hand, in the second horizontal CCD section 103b on the other side (right side in the figure) of the transfer branching position X, the transfer gate 15a in the second layer and the transfer gate 14a in the first layer positioned on the right side and adjacent to the transfer gate 15a are connected respectively via contacts 16a and 16b to the metal wiring 10 that supplies the first driving pulse φH1, and the transfer gate 15b in the second layer and the transfer gate 14b positioned on the right side and adjacent to the transfer gate 15b are connected respectively via contacts 17a and 17b to the metal wiring 11 that supplies the second driving pulse φH2. As a result, in the second horizontal CCD 103b, the transfer gate 15a in the second layer and the transfer gate 14a in the first layer positioned on the right side form a φH1 transferring electrode 12, and the transfer gate 15b in the second layer and the transfer gate 14b positioned on the left side form a φH2 transferring electrode 13.

In addition, in the transfer branching position X, the transfer gate 15b in the second layer positioned on the transfer branching position X is connected by the contact 17b to the metal wiring 11 that supplies the second driving pulse φH2. The transfer gate 14b, which is positioned on the left side of the transfer gate 15b positioned on the transfer branching position X, is connected by the contact 17a to the metal wiring 11. The transfer gate 14b, which is in the first layer positioned on the right side of the transfer gate 15b in the second layer on the transfer branching position X, is connected by the contact 17a to the metal wiring 11.

Further, an electric field directing area 19 is implanted below the transfer gates 15a and 15b in the second layer.

FIG. 2(b) illustrates a plan view pattern of the transfer gates 14a and 14b in the first layer in the first horizontal CCD section 103a. FIG. 2(c) illustrates a plan view pattern of the transfer gates 14a and 14b in the first layer in the second horizontal CCD section 103b described above. Thus, the solid-state image capturing apparatus according to the embodiment is configured by changing the plan view pattern of the φH1 wiring 10 (metal wiring) and the φH2 wiring 11 (metal wiring) from the conventional pattern and forming the transfer branching position X. That is, a mask pattern of the metal wiring layer is changed for one layer.

Therefore, in the first CCD section 103a for performing the transfer in the left direction to the output section on the left end, the arrangement order for the contacts, which connect the transfer gates 14a and 14b in the first layer and the transfer gates 15a and 15b in the second layer to the metal wirings 10 and 11, is arranged in the order of the positions of the transfer gates from the left side of FIG. 2. That is, the order is arranged with the contact 17a connecting the (φH2 wiring 11 and the transfer gate 14b in the first layer, the contact 17b connecting the φH2 wiring 11 and the transfer gate 15b in the second layer, the contact 16a connecting the 15b H1 wiring 10 and the transfer gate 14a in the first layer, the contact 16b connecting the φH1 wiring 10 and the transfer gate 15a in the second layer, the contact 17a connecting the φH2 wiring 11 and the transfer gate 14b in the first layer . . . from the left side of FIG. 2. With such a connection, the electric charges in the horizontal transfer section are transferred by the transfer pulse φH1 and the transfer pulse φH2 described above in the left direction where the output section 4 is located.

On the other hand, in the second CCD section 103b positioned on the right side of the transfer branching position X, the arrangement order for the contacts, which connect the transfer gates 14a and 14b in the first layer and the transfer gates 15a and 15b in the second layer to the metal wirings 10 and 11, is arranged in the order of the positions of the transfer gates. That is, the arrangement order begins with the contact 17b connecting the φH2 wiring 11 and the transfer gate 15b in the second layer, the contact 17a connecting the φH2 wiring 11 and the transfer gate 14b in the first layer, the contact 16b connecting the (φH1 wiring 10 and the transfer gate 15a in the first layer, the contact 16a connecting the φH1 wiring 10 and the transfer gate 14a in the first layer, the contact 17b connecting the φH2 wiring 11 and the transfer gate 15b in the second layer . . . from the left side of FIG. 2. With such a connection, the electric charges in the second CCD section 103b are transferred in the left direction opposite from the output section 4 (in the right direction in the figure).

Next, an operation will be described.

In the solid-state image capturing apparatus 100 according to Embodiment 1, the area used for image capturing in the effective pixel area is defined as the pixel cutting out area 25. Therefore, the transfer branching position X in the horizontal transfer section 103 is set in the position corresponding to the right end of the pixel cutting out area 25.

In the solid-state image capturing apparatus 100 according to Embodiment 1, electric charges generated in each pixel section are transferred in the vertical direction by the vertical transfer section 2. When the electric charges are sent to the horizontal transfer section 103 for each pixel row by the transfer in the vertical direction, the horizontal transfer section 103 transfers the electric charges in the horizontal direction for each pixel row.

At this stage, in the horizontal transfer section 103, electric charges in the CCD section 103a on the left side of the transfer branching position X are transferred to the output section 4 and electric charges in the CCD section 103b on the right side of the transfer branching position X are transferred to a longitudinal edge section of the horizontal sweeping drain 106, both by the two-phase driving pulses φH1 and φH2 to the transfer gates.

That is, in the CCD section 103a on the left side of the horizontal transfer gate 103, the first driving pulse φH1 is applied to the transfer gate 15a in the second layer positioned on the electric field directing area 19 and to the transfer gate 14a in the first layer on the left side of the transfer gate 15a, and the second driving pulse φH2 is applied to the transfer gate 15b in the second layer positioned on the electric field directing area 19 and to the transfer gate 14b in the first layer on the left side of the transfer gate 15b. Subsequently, when the driving pulse φH1 is in a high level, the potential level becomes deeper in the lower side of the transfer gate 14a in the first layer than the lower side of the transfer gate 15a in the second layer. Electric charges will always move to the left side in the transfer areas associated with these transfer gates. In addition, when the driving pulse φH2 is in a high level, the potential level becomes deeper in the lower side of the transfer gate 14b in the first layer than the lower side of the transfer gate 15b in the second layer. Electric charges will always move to the left side in the transfer areas associated with these transfer gates. As a result, electric charges in the CCD section 103a on the left side of the horizontal transfer section 103 are transferred to the output section 4 side by the alternate change of the driving pulses φH1 and φH2 described above in high and low levels, as illustrated in FIG. 4.

On the other hand, in the CCD section 103b on the right side of the horizontal transfer gate 103, the first driving pulse φH1 is applied to the transfer gate 15a in the second layer positioned on the electric field directing area 19 and to the transfer gate 14a in the first layer on the right side of the transfer gate 15a, and the second driving pulse φH2 is applied to the transfer gate 15b in the second layer positioned on the electric field directing area 19 and to the transfer gate 14b in the first layer on the right side of the transfer gate 15b. Subsequently, when the driving pulse φH1 is in a high level, the potential level becomes deeper in the lower side of the transfer gate 14a in the first layer than the lower side of the transfer gate 15a in the second layer. Electric charges will always move to the right side in the transfer areas associated with these transfer gates. In addition, when the driving pulse φH2 is in a high level, the potential level becomes deeper in the lower side of the transfer gate 14b in the first layer than the lower side of the transfer gate 15b in the second layer. Electric charges will always move to the right side in the transfer areas associated with these transfer gates. As a result, electric charges in the CCD section 103b on the right side of the horizontal transfer section 103 are transferred to the longitudinal edge section of the horizontal sweeping drain by the alternate change of the driving pulses φH1 and φH2 described above in high and low levels, as illustrated in FIG. 4.

The number of horizontal steps among the number of the total effective pixels is defined as N, and the number of horizontal transfer steps from the left end of the pixel row to the transfer branching position X, that is the number of transfer electrodes configured with a pair of adjacent transfer gates (transfer gate in the first layer and the transfer gate in the second layer), is defined as M. At this stage, the transfer period of one horizontal line is complete in the clock of M time(s), and the number of horizontal steps N among the number of the total effective pixels>the number of horizontal transfer steps M to the transfer branching position (the minimum value of M=N/2) holds. Therefore, the horizontal transfer period can be significantly shortened. Further, a process for sweeping out unnecessary electric charges can be performed at the same time.

According to Embodiment 1 with the configuration described above, in the solid-state image capturing apparatus 100 including the plurality of pixel sections 1 arranged in a two dimensional array for performing photoelectric conversions on incident light to generate electric charges; the vertical transfer section 2 positioned in association with each pixel column for transferring the electric charges read out from pixels of each pixel column in the vertical direction; the horizontal transfer section 103 for transferring the electric charges transferred from the vertical transfer section in the horizontal direction, the layout pattern is set such that the φH1 wiring 10 and the φH2 wiring 11 in the horizontal transfer section 103 are connected to corresponding transfer gates so that these wirings have opposing electric charge transferring directions on both sides of the predetermined transfer branching position X of the horizontal transfer section. Therefore, in the horizontal CCD (horizontal transfer section), the transfer branching position for the area transferring electric charges as necessary electric charges in a predetermined direction and the area for sweeping out electric charges in a reverse direction as unnecessary electric charges, can be arbitrarily set by the layout pattern for members to constitute the horizontal transfer section. Thus, necessary electric charges can be effectively transferred by the driving of the horizontal transfer section. As a result, the driving frequency of the horizontal CCD can be reduced at the time of reading out the necessary electric charges from a partial area of the effective pixel area without adding another circuit configuration for sweeping out unnecessary electric charges.

Embodiment 2

Figure 5:
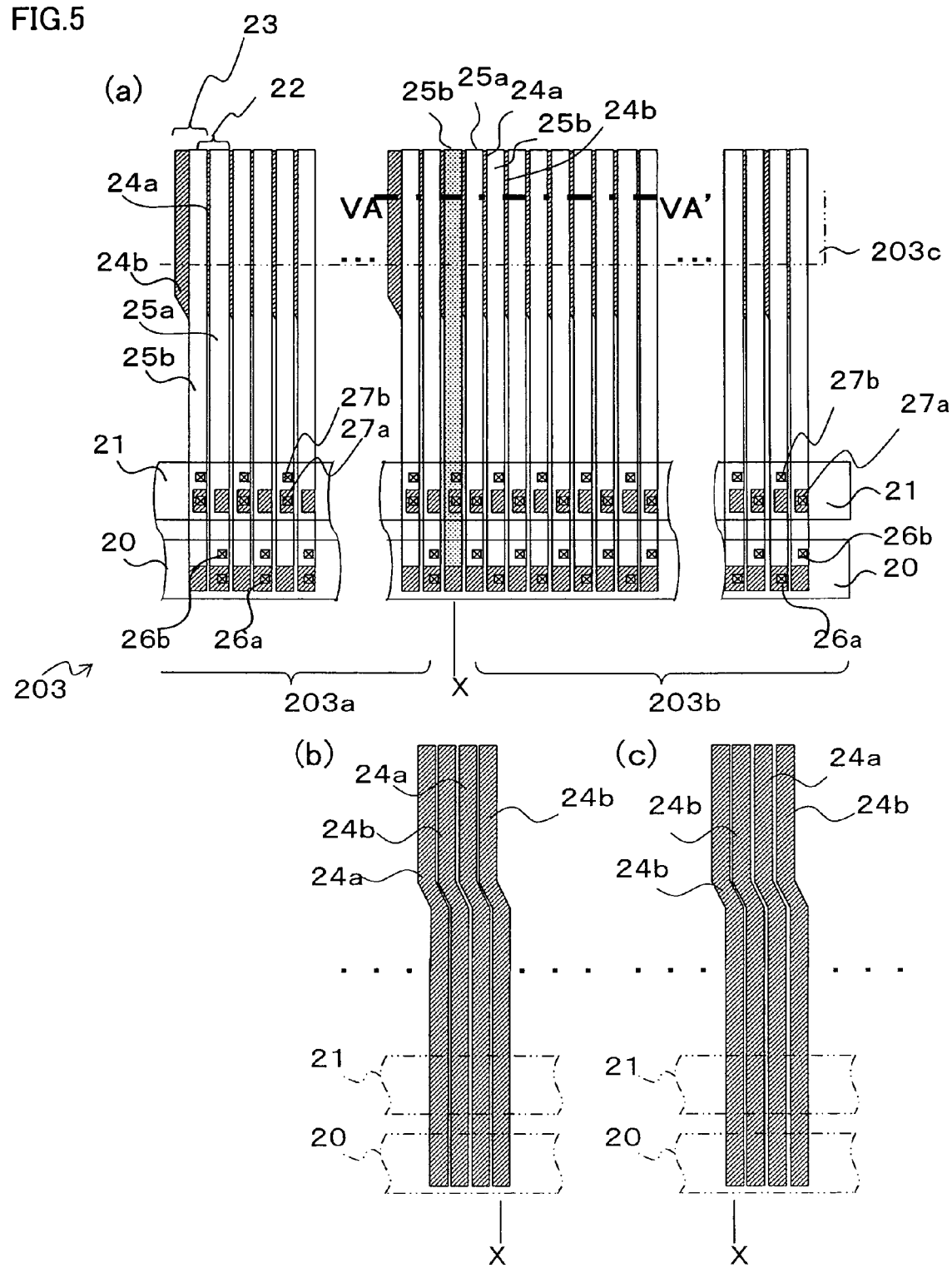
FIG. 5 is a diagram explaining a solid-state image capturing apparatus according to Embodiment 2.

FIG. 5 is a diagram illustrating a solid-state image capturing apparatus according to Embodiment 2 of the present invention, illustrating a layout of a transfer gate and a wiring in its horizontal transfer section (FIG. 5(a)) and a plan view form of a transfer gate in a first layer (FIGS. 5(b) and 5(c)).

Similar to the solid-state image capturing apparatus according to Embodiment 1, the solid-state image capturing apparatus according to Embodiment 2 includes: a plurality of pixel sections positioned in a matrix for photoelectrically converting an incident light into a signal charge; a vertical transfer section for reading out the signal charge stored in each of the pixel sections to transfer it in a column direction (vertical direction); a horizontal transfer section for transferring the signal charge from the vertical transfer section in a row direction (horizontal direction); and an output section for amplifying the transferred signal charge and outputting it as an image capturing signal. The solid-state image capturing apparatus according to Embodiment 2 includes a different plan view pattern of a transfer gate, a $\phi$H1 wiring and a $\phi$H2 wiring in the horizontal transfer section from the pattern of the solid-state image capturing apparatus according to Embodiment 1. However, these patterns are the same in the left and right portions of the transfer branching position in the horizontal transfer section. According to Embodiment 2, the arrangement pattern of a contact that connects the transfer gate and the wiring is different in the left and right portions of the transfer branching position. Since other configurations of Embodiment 2 are the same as those of Embodiment 1 described above, a connecting configuration of the transfer gate and the wiring in the horizontal transfer section will be described hereinafter.

As illustrated in FIG. 5(a), the horizontal transfer section 203 is arranged therein with a plurality of transfer gates 24a, 24b, 25a and 25b consecutively and repetitively in the horizontal transfer direction for transferring electric charges transferred from the vertical transfer section 2 in the horizontal direction.

Herein, the transfer gates 24a and 24b are transfer gates in the first layer, the transfer gates being formed by placing a first polysilicon film using a mask pattern. Further, the transfer gates 25a and 25b are transfer gates in the second layer, the transfer gates being formed by placing a second polysilicon film positioned above the first polysilicon film using a mask pattern.

In addition, a first driving pulse $\phi$H1 is applied to the transfer gates 24a and 25a, and a second driving pulse $\phi$H2 is applied to the transfer gates 24b and 25b. That is, according to Embodiment 2 of the present invention, the horizontal transfer section 203 is configured to transfer signal charges of one packet by two-phase gates, to which the first and second driving pulses $\phi$H1 and $\phi$H2 are applied.

In detail, the transfer gate 25b in the second layer is positioned in a transfer branching position X of the horizontal transfer section 203. In addition, the transfer gate 25a in the second layer, the transfer gate 24a in the first layer, the transfer gate 25b in the second layer, and the transfer gate 24b in the first layer are repetitively arranged in a first horizontal CCD section 203a positioned on one side of the transfer branching position X, for transferring electric charges to the output section 4, in this order towards the direction to which electric charges are transferred (left direction in the figure). Further, the transfer gate 25a in the second layer, the transfer gate 24a in the first layer, the transfer gate 25b in the second layer, and the transfer gate 24b in the first layer are repetitively arranged in a second horizontal CCD section 203b positioned on the other side of the transfer branching position X for transferring electric charges towards the sweeping drain 106, in this order towards the direction to which electric charges are transferred (right direction in the figure).

Further, in an electric charge transfer area 203c for transferring electric charges below the transfer gates 25a and 25b in the second layer, a diffusion area 19 (see FIG. 4) is formed for orienting an electric field so that a transferring direction is determined for transferring electric charges when the driving pulse described above is applied. Note that the cross section along VA-VA' in FIG. 5 is the same as the cross sectional structure along IIA-IIA' in FIG. 2 illustrated in FIG. 4.

On the end of one side of the transfer gates, wirings 20 and 21 are positioned for supplying a two-phase driving pulse of each of the transfer gates described above. The wirings are formed by placing metal films formed in a pattern with an insulation film interposed above a polysilicon film forming the transfer gates described above. The wirings are connected to each of the transfer gates through a contact hole that penetrates the insulation film.

That is, in the first horizontal CCD section 203a on the one side (left side in the figure) of the transfer branching position X, the transfer gate 25a in the second layer and the transfer gate 24a in the first layer positioned on the left side and adjacent to the transfer gate 25a are connected respectively via contacts 16a and 16b to the metal wiring 20 that supplies the first driving pulse $\phi$H1, and the transfer gate 25b in the second layer and the transfer gate 24b positioned on the left side and adjacent to the transfer gate 25b are connected respectively via contacts 17a and 17b to the metal wiring 21 that supplies the second driving pulse $\phi$H2. As a result, in the first horizontal CCD 203a, the transfer gate 25a in the second layer and the transfer gate 24a in the first layer positioned on the left side form a $\phi$H1 transferring electrode 22, and the transfer gate 25b in the second layer and the transfer gate 24b positioned on the left side form a $\phi$H2 transferring electrode 23.

On the other hand, in the second horizontal CCD section 203b on the other side (right side in the figure) of the transfer branching position X, the transfer gate 25a in the second layer and the transfer gate 24a in the first layer positioned on the right side and adjacent to the transfer gate 25a are connected respectively via contacts 26a and 26b to the metal wiring 20 that supplies the first driving pulse $\phi$H1, and the transfer gate 25b in the second layer and the transfer gate 24b positioned on the right side and adjacent to the transfer gate 25b are connected respectively via contacts 27a and 27b to the metal wiring 21 that supplies the second driving pulse $\phi$H2. As a result, in the second horizontal CCD 203b, the transfer gate 25a in the second layer and the transfer gate 24a in the first layer positioned on the right side form a $\phi$H1 transferring electrode 22, and the transfer gate 25b in the second layer and the transfer gate 24b positioned on the left side form a $\phi$H2 transferring electrode 23.

In addition, in the transfer branching position X, the transfer gate 25b in the second layer positioned on the transfer branching position X is connected by the contact 17b to the metal wiring 11 that supplies the second driving pulse $\phi$H2. The transfer gate 24b, which is positioned on the left side of the transfer gate 25b positioned on the transfer branching position X, is connected by the contact 27a to the metal wiring 21. The transfer gate 24b, which is in the first layer positioned on the right side of the transfer gate 25b in the second layer on the transfer branching position X, is connected by the contact 27a to the metal wiring 21.

FIG. 5(b) illustrates plan view patterns of the transfer gates 24a and 24b in the first layer in the first horizontal CCD section 203a, and FIG. 5(c) illustrates plan view patterns of the transfer gates 24a and 24b in the first layer in the second horizontal CCD section 203b. The plan view patterns of these transfer gates are the same in this embodiment.

Thus, the solid-state image capturing apparatus according to Embodiment 2 has a layout pattern of the contact connecting the transfer gate and the wiring, the layout pattern being different in the left and right portions of the transfer branching position in the horizontal transfer section such that corresponding transfer gates are connected to the φH1 wiring and the (φH2 wiring so that electric charge transferring directions will be opposite on both sides of the predetermined transfer branching position X of the horizontal transfer section.

Next, an operation will be described.

In the solid-state image capturing apparatus according to Embodiment 2, as well, electric charges generated in each pixel section are transferred in the vertical direction by the vertical transfer section 2. When the electric charges are sent to the horizontal transfer section 203 for each pixel row by this vertical transferring, the horizontal transfer section 203 transfers the electric charges for each pixel row in the horizontal direction.

At this stage, in the horizontal transfer section 203, electric charges in the CCD section 203a on the left side of the transfer branching position X are transferred to the output section and electric charges in the CCD section 203b on the right side of the transfer branching position X are transferred to a longitudinal end section side of the horizontal sweeping drain, both by the two-phase driving pulses φH1 and φH2 to the transfer gates.

That is, in the CCD section 203a on the left side of the horizontal transfer gate 203, the first driving pulse φH1 is applied to the transfer gate 25a in the second layer positioned on the electric field directing area and to the transfer gate 24a in the first layer on the left side of the transfer gate 25a, and the second driving pulse φH2 is applied to the transfer gate 25b in the second layer positioned on the electric field directing area and to the transfer gate 24b in the first layer on the left side of the transfer gate 25b. Subsequently, electric charges move to the left side, as similar to Embodiment 1.

On the other hand, in the CCD section 203b on the right side of the horizontal transfer gate 203, the first driving pulse φH1 is applied to the transfer gate 25a in the second layer positioned on the electric field directing area and to the transfer gate 24a in the first layer on the right side of the transfer gate 25a, and the second driving pulse φH2 is applied to the transfer gate 25b in the second layer positioned on the electric field directing area and to the transfer gate 24b in the first layer on the right side of the transfer gate 25b. Subsequently, electric charges move to the right side, and the electric charges are transferred to the longitudinal end section of the horizontal sweeping drain, as similar to Embodiment 1.

According to Embodiment with the configuration described above, in the solid-state image capturing apparatus including the plurality of pixel sections 1 arranged in a two dimensional array for performing photoelectric conversions on incident light to generate electric charges; the vertical transfer section 2 positioned associating with each pixel column for transferring the electric charges read out from pixels of each pixel column in the vertical direction; the horizontal transfer section 203 for transferring the electric charges transferred from the vertical transfer section in the horizontal direction, the layout pattern of the contact connecting the transfer gate and the wiring is changed such that corresponding transfer gates are connected to the φH1 wiring 20 and the φH2 wiring 21 so that electric charge transferring directions become opposite on both sides of the predetermined transfer branching position X of the horizontal transfer section. Therefore, in the horizontal CCD (horizontal transfer section), the transfer branching position for the area transferring electric charges as necessary electric charges in a predetermined direction and the area for sweeping out electric charges in a reverse direction as unnecessary electric charges, can be arbitrarily set by the layout pattern of the contact. Thus, necessary electric charges can be effectively transferred by the driving of the horizontal transfer section. As a result, the driving frequency of the horizontal CCD can be reduced at the time of reading out the necessary electric charges from a partial area of the effective pixel area without adding another circuit configuration for sweeping out unnecessary electric charges.

Embodiment 3

Figure 6:
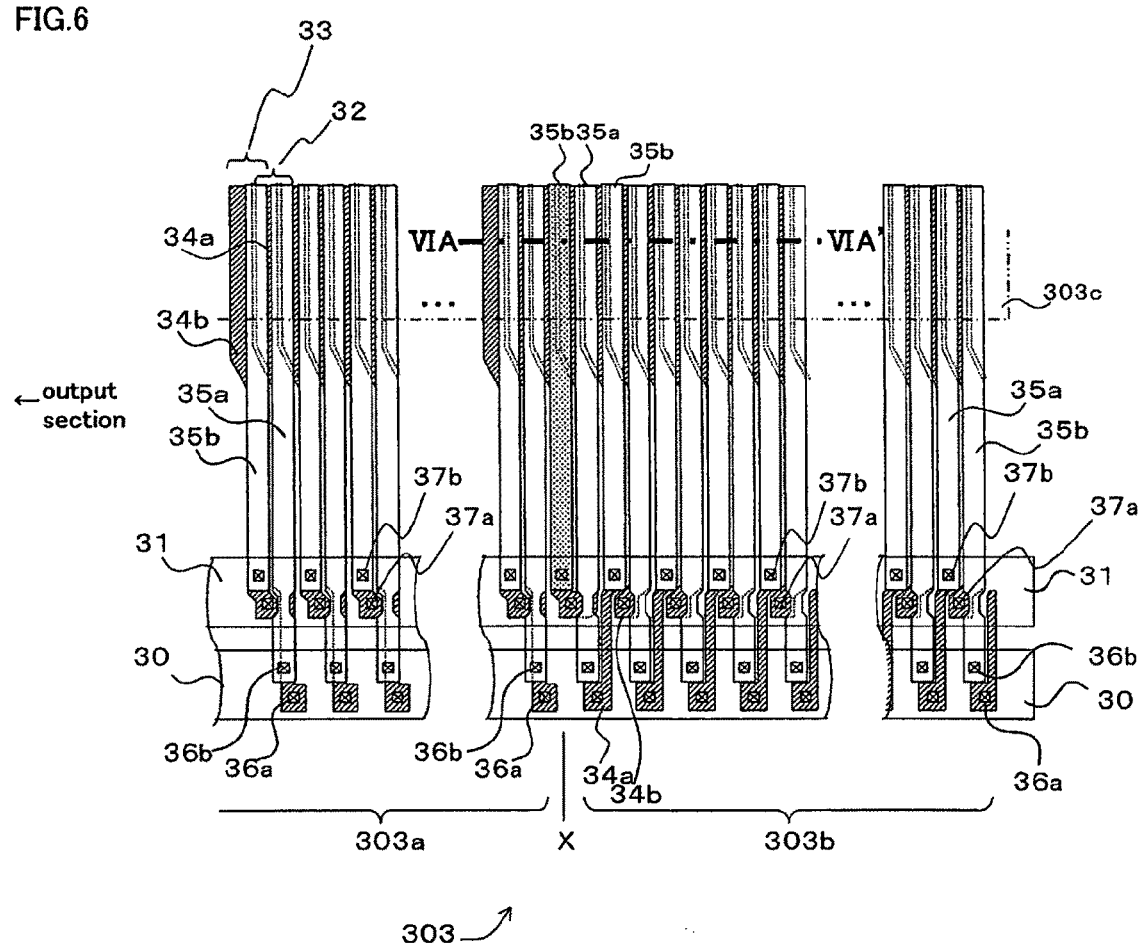
FIG. 6 is a diagram explaining a solid-state image capturing apparatus according to Embodiment 3, illustrating a layout of a transfer gate and a wiring in a horizontal transfer section.
Figure 7:
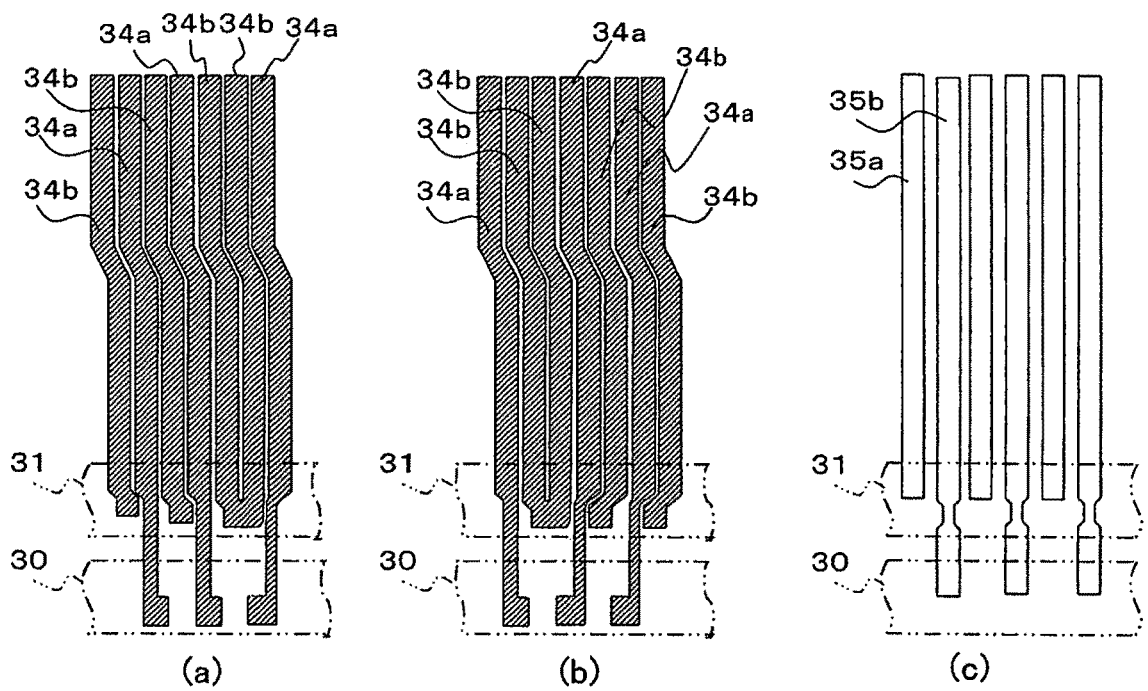
FIG. 7 is a diagram explaining a solid-state image capturing apparatus according to Embodiment 3.

FIGS. 6 and 7 are diagrams illustrating a solid-state image capturing apparatus according to Embodiment 3 of the present invention. FIG. 6 illustrates a layout of a transfer gate and a wiring in a horizontal transfer section. FIG. 7 illustrates a plan view form of a transfer gate in a first layer (FIGS. 7(a), 7(b)), and a plan view form of a transfer gate in a second layer (FIG. 7(c)).

According to the solid-state image capturing apparatus of Embodiment 3, the layout pattern of the transfer gate is set such that corresponding transfer gates are connected to the φH1 wiring 30 and the φH2 wiring 31 so that electric charge transferring directions become opposite on both sides of the predetermined transfer branching position X of the horizontal transfer section. That is, in Embodiment 3, the layout pattern of the transfer gate, instead of the layout pattern of the wiring in Embodiment 1 or the layout pattern of the contact in Embodiment 2, is set to be different in the left and right portions of the transfer branching position in the horizontal transfer section. Except for this point, the configuration is the same as those of the other embodiments described above.

As illustrated in FIG. 6, the horizontal transfer section 303 of the solid-state image capturing apparatus according to Embodiment 3 is arranged therein with a plurality of transfer gates 34a, 34b, 35a and 35b consecutively and repetitively in the horizontal transfer direction for transferring electric charges transferred from the vertical transfer section 2 in the horizontal direction.

Herein, the transfer gates 34a and 34b are transfer gates in the first layer, the transfer gates being formed by placing a first polysilicon film using a mask pattern. Further, the transfer gates 35a and 35b are transfer gates in the second layer, the transfer gates being formed by placing a second polysilicon film positioned above the first polysilicon film using a mask pattern.

In addition, a first driving pulse φH1 is applied to the transfer gates 34a and 35a, and a second driving pulse φH2 is applied to the transfer gates 34b and 35b. That is, according to Embodiment 3 of the present invention, the horizontal transfer section 303 is configured to transfer signal charges of one packet by two-phase gates, to which the first and second driving pulses φH1 and φH2 are applied.

In detail, the transfer gate 35b in the second layer is positioned in a transfer branching position X of the horizontal transfer section 303. In addition, the transfer gate 35a in the second layer, the transfer gate 34a in the first layer, the transfer gate 35b in the second layer, and the transfer gate 34b in the first layer are repetitively arranged in a first horizontal CCD section 303a positioned on one side of the transfer branching position X, for transferring electric charges to the output section, in this order towards the direction to which electric charges are transferred (left direction in the figure). Further, the transfer gate 35a in the second layer, the transfer gate 34a in the first layer, the transfer gate 35b in the second layer, and the transfer gate 34b in the first layer are repetitively arranged in the second horizontal CCD section 203b positioned on the other side of the transfer branching position X for transferring electric charges towards the sweeping drain, in this order towards the direction to which electric charges are transferred (right direction in the figure).

Further, in an electric charge transfer area for transferring electric charges below the transfer gates 35a and 35b in the second layer, a diffusion area (see FIG. 4) is formed for orienting an electric field so that a transferring direction is determined for transferring electric charges when the driving pulse described above is applied. Note that the cross section along VIA-VIA' in FIG. 6 is the same as the cross-sectional structure along IIA-IIA' in FIG. 2 illustrated in FIG. 4.

On the end of one side of the transfer gates, wirings 30 and 31 are positioned for supplying a two-phase driving pulse of each of the transfer gates described above. The wirings are formed by placing metal films formed in a pattern with an insulation film interposed above a polysilicon film forming the transfer gates described above. The wirings are connected to each of the transfer gates through a contact hole that penetrates the insulation film.

That is, in the first horizontal CCD section 303a on the one side (left side in the figure) of the transfer branching position X, the transfer gate 35a in the second layer and the transfer gate 34a in the first layer positioned on the left side and adjacent to the transfer gate 35a are connected respectively via contacts 36a and 36b to the metal wiring 30 that supplies the first driving pulse $\phi$H1, and the transfer gate 35b in the second layer and the transfer gate 34b positioned on the left side and adjacent to the transfer gate 35b are connected respectively via contacts 37a and 37b to the metal wiring 21 that supplies the second driving pulse $\phi$H2. As a result, in the first horizontal CCD 303a, the transfer gate 35a in the second layer and the transfer gate 34a in the first layer positioned on the left side form a $\phi$H1 transferring electrode 32, and the transfer gate 35b in the second layer and the transfer gate 34b positioned on the left side form a $\phi$H2 transferring electrode 33.

On the other hand, in a second horizontal CCD section 303b on the other side (right side in the figure) of the transfer branching position X, the transfer gate 35a in the second layer and the transfer gate 34a in the first layer positioned on the right side and adjacent to the transfer gate 35a are connected respectively via contacts 36a and 36b to the metal wiring 30 that supplies the first driving pulse $\phi$H1, and the transfer gate 35b in the second layer and the transfer gate 34b positioned on the right side and adjacent to the transfer gate 35b are connected respectively via contacts 37a and 37b to the metal wiring 31 that supplies the second driving pulse $\phi$H2. As a result, in the second horizontal CCD 303b, the transfer gate 35a in the second layer and the transfer gate 34a in the first layer positioned on the right side form a $\phi$H1 transferring electrode 32, and the transfer gate 35b in the second layer and the transfer gate 34b positioned on the left side form a $\phi$H2 transferring electrode 33.

In addition, in the transfer branching position X, the transfer gate 35b in the second layer positioned on the transfer branching position X is connected by the contact 37b to the metal wiring 11 that supplies the second driving pulse $\phi$H2. The transfer gate 34b, which is positioned on the left side of the transfer gate 35b positioned on the transfer branching position X, is connected by the contact 37a to the metal wiring 31. The transfer gate 34b, which is in the first layer positioned on the right side of the transfer gate 35b in the second layer on the transfer branching position X, is connected by the contact 37a to the metal wiring 31.

Further, an electric field directing area is implanted below the transfer gates 35a and 35b in the second layer.

Thus, according to the solid-state image capturing apparatus of Embodiment 3, the plan view patterns of the transfer gates 34a and 34b in the first layer and the plan view patterns of the transfer gates 35a and 35b in the second layer have been changed from those of Embodiment 1 to form the transfer branching position. The plan view patterns of the transfer gates 35a and 35b in the second layer are set to be the same on both side portions of the transfer branching position X and the plan view patterns of the transfer gates 34a and 34b in the first layer are set to be different on both side portions of the transfer branching position X.

Next, an operation will be described.

In the solid-state image capturing apparatus according to Embodiment 3, as well, electric charges generated in each pixel section are transferred in the vertical direction by the vertical transfer section 2. When the electric charges are sent to the horizontal transfer section 303 for each pixel row by this vertical transferring, the horizontal transfer section 303 transfers the electric charges for each pixel row in the horizontal direction.

At this stage, in the horizontal transfer section 303, electric charges in the CCD section 303a on the left side of the transfer branching position X are transferred to the output section and electric charges in the CCD section 303b on the right side of the transfer branching position X are transferred to a longitudinal end section side of the horizontal sweeping drain, both by the two-phase driving pulses $\phi$H1 and $\phi$H2 to the transfer gates.

That is, in the CCD section 303a on the left side of the horizontal transfer gate 303, the first driving pulse $\phi$H1 is applied to the transfer gate 35a in the second layer positioned on the electric field directing area and to the transfer gate 34a in the first layer on the left side of the transfer gate 35a, and the second driving pulse $\phi$H2 is applied to the transfer gate 35b in the second layer positioned on the electric field directing area and to the transfer gate 34b in the first layer on the left side of the transfer gate 35b. Subsequently, electric charges move to the left side, as similar to Embodiment 1.

On the other hand, in the CCD section 303b on the right side of the horizontal transfer gate 303, the first driving pulse $\phi$H1 is applied to the transfer gate 35a in the second layer positioned on the electric field directing area and to the transfer gate 34a in the first layer on the right side of the transfer gate 35a, and the second driving pulse $\phi$H2 is applied to the transfer gate 35b in the second layer positioned on the electric field directing area and to the transfer gate 34b in the first layer on the right side of the transfer gate 35b. Subsequently, electric charges move to the right side, and the electric charges are transferred to the longitudinal end section of the horizontal sweeping drain, as similar to Embodiment 1.

According to Embodiment with the configuration described above, in the solid-state image capturing apparatus including the plurality of pixel sections 1 arranged in a two dimensional array for performing photoelectric conversions on incident light to generate electric charges; the vertical transfer section 2 positioned associating with each pixel column for transferring the electric charges read out from pixels of each pixel column in the vertical direction; the horizontal transfer section 303 for transferring the electric charges transferred from the vertical transfer section in the horizontal direction, the layout pattern of the corresponding transfer gate is set such that corresponding transfer gates are connected to the φH1 wiring 30 and the φH2 wiring 31 so that electric charge transferring directions become opposite on both sides of the predetermined transfer branching position X of the horizontal transfer section. Therefore, in the horizontal CCD (horizontal transfer section), the transfer branching position for the area transferring electric charges as necessary electric charges in a predetermined direction and the area for sweeping out electric charges in a reverse direction as unnecessary electric charges, can be arbitrarily set by the layout pattern of the transfer gate. Thus, necessary electric charges can be effectively transferred by the driving of the horizontal transfer section. As a result, the driving frequency of the horizontal CCD can be reduced at the time of reading out the necessary electric charges from a partial area of the effective pixel area without adding another circuit configuration for sweeping out unnecessary electric charges.

In each of the embodiments described above, the φH1 wiring and the φH2 wiring are formed with the pattern of the same metal wiring layer. However, these wirings may be formed with the pattern of different metal layers.

Further, in each of the embodiments described above, the driving signal applied to the transfer gate is a two-phase driving signal. However, the horizontal transfer section may be driven by a driving signal of three phases or more.

Further, in each of the embodiments described above, the solid-state image capturing apparatus is illustrated as including the output section positioned only on one side of the horizontal transfer section. However, in the solid-state image capturing apparatus, the output section may be positioned on both sides of the horizontal transfer section and necessary electric charges may be transferred separately by each output section, so that the transfer efficiency can be increased. In this case, the electric charges processed in each output section are necessary electric charges, and in image data can be made by processing the outputs of both output sections together in a signal processing circuit in the later step.

In addition, in the embodiments described above, the transfer branching position X is set to be in the middle portion of the horizontal transfer section. However, the transfer branching position X may be set on the end of one side or the other end side of the horizontal transfer section by changing the layout pattern of the horizontal transfer section.

Further, in the embodiments described above, the layout pattern of the transfer gate or the layout pattern of the signal wiring is set such that the transfer gate and the signal wiring are connected to each other so that the electric charge transferring directions will be opposite from each other on both sides of the transfer branching position in the horizontal transfer section. However, the layout pattern of the contact layer connecting the transfer gate and the signal wiring may be set such that the transfer gate and the signal wiring are connected to each other so that the electric charge transferring directions will be opposite from each other on both sides of the transfer branching position in the horizontal transfer section. That is, any layer may be changed as long as the layout pattern of one or more layers on the members to constitute the horizontal transfer section is changed so that the electric charge transferring directions will be opposite from each other on both sides of the transfer branching position in the horizontal transfer section.

Embodiment 4

Although not specifically described in Embodiments 1 to 3 described above, an electronic information device having an image input device will be described, the electric information device, such as a digital camera (e.g., digital video camera and digital still camera), an image input camera, a scanner, a facsimile machine and a camera-equipped cell phone device, using at least any of the solid-state image capturing apparatuses according to Embodiments 1 to 3 described above in an image capturing section.

Figure 8:
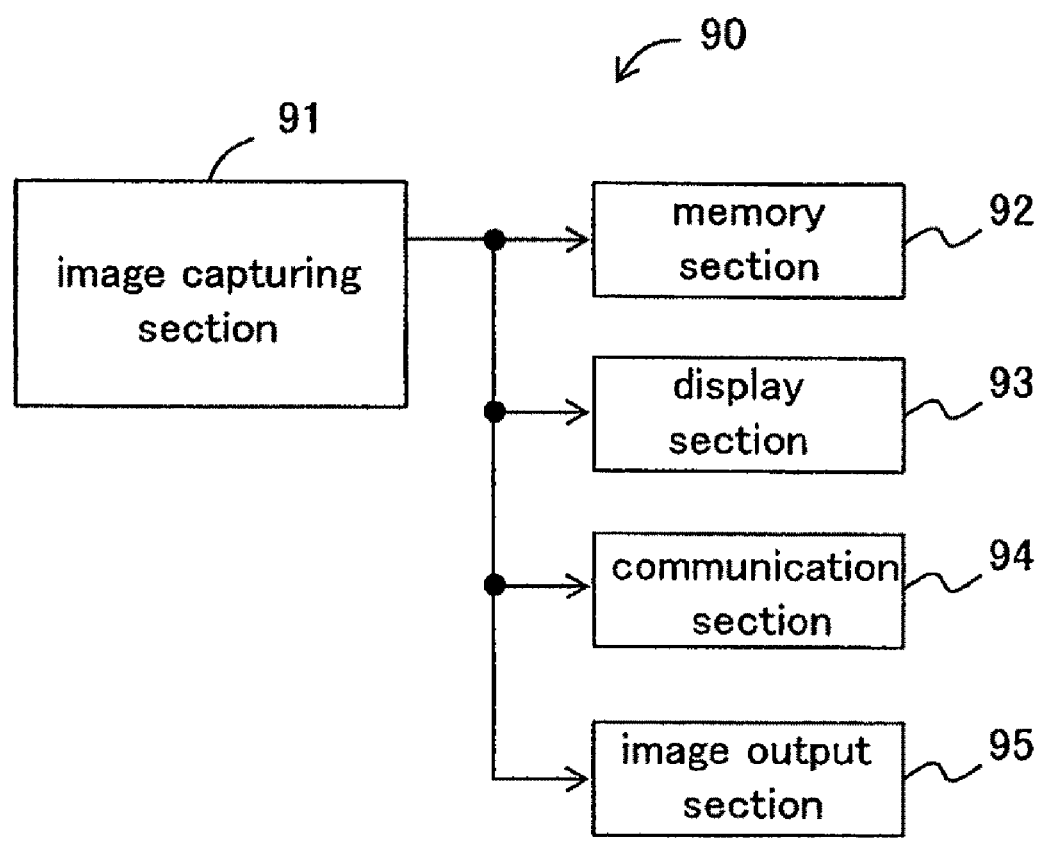
FIG. 8 is a block diagram illustrating an exemplary diagrammatic structure of an electronic information device, as Embodiment 4 of the present invention, using the solid-state image capturing apparatus according to any of Embodiments 1 to 3 of the present invention as an image input device in an image capturing section.

FIG. 8 is a block diagram illustrating an exemplary diagrammatic structure of an electronic information device, as Embodiment 4 of the present invention, using the solid-state image capturing apparatus according to any of Embodiments 1 to 3 of the present invention as an image input device in an image capturing section.

The electronic information device 90 according to Embodiment 4 of the present invention as illustrated in FIG. 8 includes any of the solid-state image capturing apparatuses according to Embodiment 1 to 3 of the present invention as an image capturing section 91 for capturing a subject. The electronic information device 90 further includes at least any of: a memory section 92 (e.g., recording media) for data-recording a high-quality image data obtained by using at least any of the solid-state image capturing apparatuses according to Embodiments 1 to 3 in an image capturing section, after a predetermined signal process is performed on the image data for recording; a display section 93 (e.g., liquid crystal display device) for displaying this image data on a display screen (e.g., liquid crystal display screen) after a predetermined signal process is performed for display; a communication section 94 (e.g., transmitting and receiving device) for communicating this image data after a predetermined signal process is performed on the image data for communication; and an image output section 95 for printing (typing out) and outputting (printing out) this image data.

As described above, the present invention is exemplified by the use of its preferred embodiments. However, the present invention should not be interpreted solely based on the embodiments described above. It is understood that the scope of the present invention should be interpreted solely based on the claims. It is also understood that those skilled in the art can implement equivalent scope of technology, based on the description of the present invention and common knowledge from the description of the detailed preferred embodiments of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can be applied in the field of a solid-state image capturing apparatus; a driving method of the solid-state image capturing apparatus; and an electronic information device using the solid-state image capturing apparatus. According to the present invention, a transfer branching position for an area for transferring electric charges as necessary electric charges in a predetermined direction and an area for transferring electric charges in a reverse direction, can be arbitrarily set inside the horizontal transfer section in the solid-state image capturing apparatus by the layout pattern for the members to constitute the horizontal transfer section. As a result, necessary electric charges can be effectively transferred by the driving of the horizontal transfer section, and further, the driving frequency of the horizontal CCD can be reduced at the time of reading out the necessary electric charges from a partial area of the effective pixel area without adding another circuit configuration for sweeping out unnecessary electric charges.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state image capturing apparatus comprising: a plurality of pixel sections positioned in an array for photoelectrically converting an incident light into a signal charge; a vertical transfer section for transferring the signal charge read out from each of the pixel sections in a vertical direction; and a horizontal transfer section for transferring the signal charge transferred from the vertical transfer section in a horizontal direction,
wherein the horizontal transfer section includes a plurality of transfer gates consecutively arranged in a horizontal direction, and a signal wiring for supplying a driving signal to the transfer gates,
wherein a layout pattern of at least one layer of constituent members constituting the horizontal transfer section is a pattern in which the transfer gates and the signal wiring are connected so that electric charge transfer directions become opposite from each other on both sides of a branching position in the horizontal transfer section.

2. A solid-state image capturing apparatus according to claim 1, wherein the horizontal transfer section includes:
a first transfer electrode configured of two adjacent transfer gates and driven by a first driving signal;
a second transfer electrode formed of two adjacent transfer gates and driven by a second driving signal, which has a reversed phase from the first driving signal;
a first signal wiring for supplying the first driving signal to the transfer gates that configure the first transfer electrode; and
a second signal wiring for supplying the second driving signal to the transfer gates that configure the first transfer electrode.

3. A solid-state image capturing apparatus according to claim 2, wherein the first signal wiring and the second signal wiring are formed by patterning a same metal layer.

4. A solid-state image capturing apparatus according to claim 2,
wherein the first signal wiring is formed by patterning a first metal layer, and
wherein the second signal wiring is formed by patterning a second metal layer, which is different from the first metal layer.

5. A solid-state image capturing apparatus according to claim 2, wherein a layout pattern of the first and second signal wirings is a pattern in which the transfer gates and the signal wiring are connected so that electric charge transferring directions are opposite from each other on both sides of a predetermined position in the horizontal transfer section.

6. A solid-state image capturing apparatus according to claim 5,
wherein one of the two adjacent transfer gates that configure the first transfer electrode is formed by patterning a first polysilicon layer, and the other of the two adjacent transfer gates is formed by patterning a second polysilicon layer different from the first polysilicon layer, and
wherein one of the two adjacent transfer gates that configure the second transfer electrode is formed by patterning the first polysilicon layer, and the other of the two adjacent transfer gates is formed by patterning the second polysilicon layer.

7. A solid-state image capturing apparatus according to claim 6, wherein the four transfer gates that configure the adjacent first and second transfer electrodes are first to fourth transfer gates consecutively arranged in a horizontal direction, and the first to fourth transfer gates have different plan view forms.

8. A solid-state image capturing apparatus according to claim 7,
wherein, on one side of a predetermined position in the horizontal transfer section, the first transfer electrode is configured of the first and second transfer gates and the second transfer electrode is configured of the third and fourth transfer gates; and
wherein, on the other side of a predetermined position in the horizontal transfer section, the first transfer electrode is configured of the second and third transfer gates and the second transfer electrode is configured of the fourth and first transfer gates.

9. A solid-state image capturing apparatus according to claim 2, wherein a layout pattern of a plurality of transfer gates that configure the first and second transfer electrodes is a pattern in which the transfer gates and the signal wiring are connected so that electric charge transferring directions become opposite from each other on both sides of a predetermined position in the horizontal transfer section.

10. A solid-state image capturing apparatus according to claim 9,
wherein one of the two adjacent transfer gates that configure the first transfer electrode is formed by patterning a first polysilicon layer, and the other of the two adjacent transfer gates is formed by patterning a second polysilicon layer different from the first polysilicon layer, and
wherein one of the two adjacent transfer gates that configure the second transfer electrode is formed by patterning the first polysilicon layer, and the other of the two adjacent transfer gates is formed by patterning the second polysilicon layer.

11. A solid-state image capturing apparatus according to claim 10, wherein the four transfer gates that configure the adjacent first and second transfer electrodes are first to fourth transfer gates consecutively arranged in a horizontal direction, the first transfer gate and the third transfer gate having the same plan view form, and the second transfer gate and the fourth transfer gate having the same plan view form.

12. A solid-state image capturing apparatus according to claim 11,
wherein, on one side of a predetermined position in the horizontal transfer section, the first transfer electrode is configured of the first and second transfer gates and the second transfer electrode is configured of the third and fourth transfer gates; and
wherein, on the other side of a predetermined position in the horizontal transfer section, the first transfer electrode is configured of the second and third transfer gates and the second transfer electrode is configured of the fourth and first transfer gates.

13. A solid-state image capturing apparatus according to claim 1, further including an output section positioned on either of one end side or the other end side of the horizontal transfer section, for outputting a signal charge from the horizontal transfer section as an image capturing signal, wherein the horizontal transfer section transfers unnecessary electric charges from the vertical transfer section in an opposite direction of the output section from the branching position.

14. A solid-state image capturing apparatus according to claim 1, further including:
   a first output section positioned on one end side of the horizontal transfer section for outputting a signal charge from the horizontal transfer section as an image capturing signal; and
   a second output section positioned on the other end side of the horizontal transfer section for outputting a signal charge from the horizontal transfer section as an image capturing signal.

15. A solid-state image capturing apparatus according to claim 1, wherein the branching position is set at an arbitrary position in the horizontal transfer section by changing one or more layers of a layout pattern of constituent members that constitute the horizontal transfer section.

16. A solid-state image capturing apparatus according to claim 15, wherein mask patterns other than mask patterns corresponding to the changed layout pattern are shared among solid-state image capturing apparatuses having the different branching positions.

17. A solid-state image capturing apparatus according to claim 1, further including a horizontal drain positioned on the opposite side of the output section of the horizontal transfer section, for sweeping out the unnecessary electric charges.

18. A solid-state image capturing apparatus according to claim 1, wherein the horizontal transfer section is configured to set the predetermined position by the layout pattern for the constituent members which constitute the horizontal transfer section, so that pixel sections with fewer than the number of the effective pixels, which is the number of the plurality of pixel sections positioned in an array, is used as pixel sections that constitute an image capturing area.

19. A solid-state image capturing apparatus according to claim 1, wherein a layout pattern of the constituent members, which constitute the horizontal transfer section, is any of a layout pattern of the transfer gates, a layout pattern of the signal wiring, and a layout pattern of a contact layer connecting the transfer gates and the signal wiring.

20. A solid-state image capturing apparatus according to claim 1, wherein the horizontal transfer section drives the transfer gates by a driving signal of three phases or more.

21. A driving method for driving the solid-state image capturing apparatus according to claim 1, in which a driving signal is supplied to a plurality of transfer gates in a horizontal transfer section in the solid-state image capturing apparatus, so that, on one side of a branching position of the horizontal transfer section, electric charges from the vertical transfer section are transferred as necessary electric charges to a signal processing section positioned on one end side of the horizontal transfer section, and on the other side of the branching position of the horizontal transfer section, electric charges from the vertical transfer section are transferred as unnecessary electric charges to an electric charge sweeping section positioned on the other end side.

22. A driving method for driving the solid-state image capturing apparatus according to claim 1, in which a driving signal is supplied to a plurality of transfer gates in a horizontal transfer section in the solid-state image capturing apparatus, so that, on one side of a branching position of the horizontal transfer section, electric charges from the vertical transfer section are transferred as necessary electric charges to a first signal processing section positioned on one end side of the horizontal transfer section, and on the other side of the branching position of the horizontal transfer section, electric charges from the vertical transfer section are transferred as necessary electric charges to a second signal processing section positioned on the other end side.

23. An electronic information device comprising an image capturing section, wherein the image capturing section includes the solid-state image capturing apparatus according to claim 1.

* * * * *